United States Patent
Mallinson et al.

(10) Patent No.: US 9,287,851 B2
(45) Date of Patent: Mar. 15, 2016

(54) FINITE IMPULSE RESPONSE FILTER FOR PRODUCING OUTPUTS HAVING DIFFERENT PHASES

(75) Inventors: A. Martin Mallinson, Kelowna (CA); Hu Jing Yao, Kelowna (CA); Dustin Forman, Kelowna (CA)

(73) Assignee: ESS Technology, Inc., Milpitas, CA (US)

( * ) Notice: Subject to any disclaimer, the term of this patent is extended or adjusted under 35 U.S.C. 154(b) by 149 days.

(21) Appl. No.: 13/414,487

(22) Filed: Mar. 7, 2012

(65) Prior Publication Data

US 2012/0245901 A1    Sep. 27, 2012

Related U.S. Application Data

(60) Provisional application No. 61/466,420, filed on Mar. 22, 2011.

(51) Int. Cl.
*G06F 17/50* (2006.01)
*H03H 15/02* (2006.01)

(52) U.S. Cl.
CPC .................................... *H03H 15/02* (2013.01)

(58) Field of Classification Search
CPC .......... H03H 17/0275; H03H 17/0664; H03H 17/0628; H03H 17/0685; H03H 17/06; H03H 17/0211; H03H 17/0276; H03H 17/0288; H03H 17/0294; H03H 17/0621; H03H 17/0657; H03H 17/0671; H03H 17/02; H03H 2017/0247
USPC ....................................... 703/13–17; 708/313
See application file for complete search history.

(56) References Cited

U.S. PATENT DOCUMENTS

| 3,050,700 A | 8/1962 | Powers |
| 4,799,025 A * | 1/1989 | Le Queau ................. 329/313 |
| 6,050,947 A * | 4/2000 | Rhyne .................. A61B 8/481 |
| | | 600/447 |
| 6,636,085 B2 * | 10/2003 | Okazaki et al. ............. 327/101 |
| 7,028,070 B2 * | 4/2006 | Mallinson ............. H03H 15/00 |
| | | 708/5 |
| 7,346,645 B2 | 3/2008 | Reynolds |

(Continued)

FOREIGN PATENT DOCUMENTS

| CA | WO 2012/028897 A1 * | 3/2012 | ............ H03H 17/06 |
| EP | 539776 A2 | 5/1993 | |
| EP | 1168615 A1 | 1/2002 | |

OTHER PUBLICATIONS

Woods, R., et al. FPGA-based Implementation of Signal Processing Systems, 2008 John Wily & Sons, Ltd.*

(Continued)

*Primary Examiner* — Kamini S Shah
*Assistant Examiner* — Scott S Cook
(74) *Attorney, Agent, or Firm* — Gard & Kaslow LLP

(57) ABSTRACT

A method and system for designing and implementing a finite impulse response (FIR) filter to create a plurality of output signals, each output signal having the same frequency but at a different phase shift from the other output(s), is described. Values are determined for the resistors, or other elements having impedance values, in a FIR filter having a plurality of outputs, such that each output has the same frequency response but a different phase than the other output(s). This is accomplished by the inclusion of a phase factor in the time domain calculation of the resistor values that does not change the response in the frequency domain. The phase shift is constant and independent of the frequency of the output signal.

19 Claims, 9 Drawing Sheets

(56) References Cited

U.S. PATENT DOCUMENTS

| | | | | |
|---|---|---|---|---|
| 8,412,141 | B2* | 4/2013 | Savoj | 455/307 |
| 2001/0006541 | A1* | 7/2001 | Rudolf | H04L 25/0226 |
| | | | | 375/343 |
| 2002/0062329 | A1* | 5/2002 | Capofreddi | 708/319 |
| 2003/0186671 | A1* | 10/2003 | Prodanov | H03H 17/0277 |
| | | | | 455/339 |
| 2004/0139135 | A1 | 7/2004 | Druck | |
| 2005/0168371 | A1 | 8/2005 | Yuan | |
| 2005/0270193 | A1* | 12/2005 | Dias | H03M 1/0656 |
| | | | | 341/61 |
| 2011/0057723 | A1* | 3/2011 | Miyake et al. | 327/552 |
| 2012/0041995 | A1* | 2/2012 | Laporte | 708/313 |

OTHER PUBLICATIONS

Yim, W.H., et al. Extended Polyphase Structures for Multirate DSP, IEE Procedings-F, vol. 139, No. 4, Aug. 1992.*

McClellan, J.H., Parks, T.W., A Personal History of the Parks-McClellan Algorithm, IEEE Signal Processing Magazine 82, Mar. 2005.*

Baas, B., Filter Design Slides, 2008, [retrieved Jan. 28, 2014] downloaded from the internet http://www.csee.umbc.edu/~tinoosh/cmpe691/slides/Handout.filt.coeff.design.pdf.*

Analog Devices, Inc., Mixed-Signal and DSP Design Techniques, Digital Filters, Feb. 1, 2002, [ retrieved Jan. 28, 2014] downloaded from the internet http://www.analog.com/static/imported-files/seminars_webcasts/MixedSignal_Sect6.pdf.*

ESIEE, DSP C5000, Chapter 20: Polyphase FIR Filter Implementation for Communication Systems, 2003 [ retrieved Jan. 28, 2014] downloaded from the internet http://www.ti.com/ww/cn/uprogram/share/ppt/c5000/20polyphase_v105.ppt.*

Dahnoun, N., Chapter 14: Finite Impulse Response (FIR) Filters 2004 downloaded from the internet http://www.google.com/url?sa=t&rct=j&q=&esrc=s&frm=1&source=web&cd=1&ved=0CCcQFjAA&url=http%3A%2F%2Fwww.ti.com%2Fww%Fcn%2Fuprogram%2Fshare%2Fppt%2Fc6000%2FChapter14.ppt&ei=rLznUqvAJraxsASGrYC4Aw&usg=AFQjCNG_xZh5kK7Ac8yUrtjwx9KoX1QFHQ.*

Millivojevic, Digital Filter Design, MikroEleKtronika, 2009 [retrieved on Jan. 28, 2014] downloaded from the internet http://www.mikroe.com/chapters/view/72/chapter-2-fir-filters/.*

Iosada, R.A., Practical FIR Filter Design in MATLAB, The MathWorks, Inc., Mar. 31, 2003.*

Saeed, M., MSC in Data Communications and Networks: Simulation of Blind Adaptive Equalizer based on CMA using MatLab, University of Hertfordshire, Sep. 2005.*

Nam, D., The Poly-Phase Shift Filter for a Time-Shared DAC in a Digital Convergence Ssytem, IEEE, 2002.*

Tong, T., Quadrature Phase Shifter Implemented by Polyphase Filter, EE5349 Spring 2003, The University of Texas at Arlington.*

West, J.D.K., The Application of the Asymmetric Polyphase Filter in an SSB Transceiver, IEEE, 1991.*

R. Woods, et al. (2008) "FPGA-based Implementation of Signal Processing Systems", Wiley and Sons. Ltd, Chippenham, Great Britain (accessible at http://www.progetti.t3lab.it/vialab/wp-content/uploads/download/20110517/FPGA-based%20Implementation%20of%20Complex%20Signal%20Processing%20System~tqw~_darksiderg.pdf), pp. 1-47.

"Polyphase Filtering on a RIO Target," Jul. 30, 2009, National Instruments Corporation.

Chowaniec A et al: "A wide-band quadrature phasing system using charge transfer devices", Solid State Electronics, Elsevier Science Publishers, Barking, GB, vol. 19, No. 3, Mar. 1, 1976, pp. 201-207, XP0256533348, ISSN: 0038-1101(76)9016407 [retrieved on Mar. 1, 1976] *1. Introduction; 2. Transversal filter phase properties; p. 201, left-hand column-p. 203, left-hand column; figures 1-6*.

Garvie A M et al: "Video-Based Analog Tomography", Reveiw of Scientific Instruments, AIP, Melville, NY, US, vol. 61, No. 1, Part 01, Jan. 1, 1990, pp. 138-145, XP000101222, ISSN: 1-1 column-p. 141, right-hand column; figures 3-5*.

Houts R C: "A courseware package for iterative design of FIR digital filters", Apr. 1, 1990, pp. 228-232, XP010007644, *p. 228, left-hand column-p. 230, left-hand column; figures 1-4*.

* cited by examiner

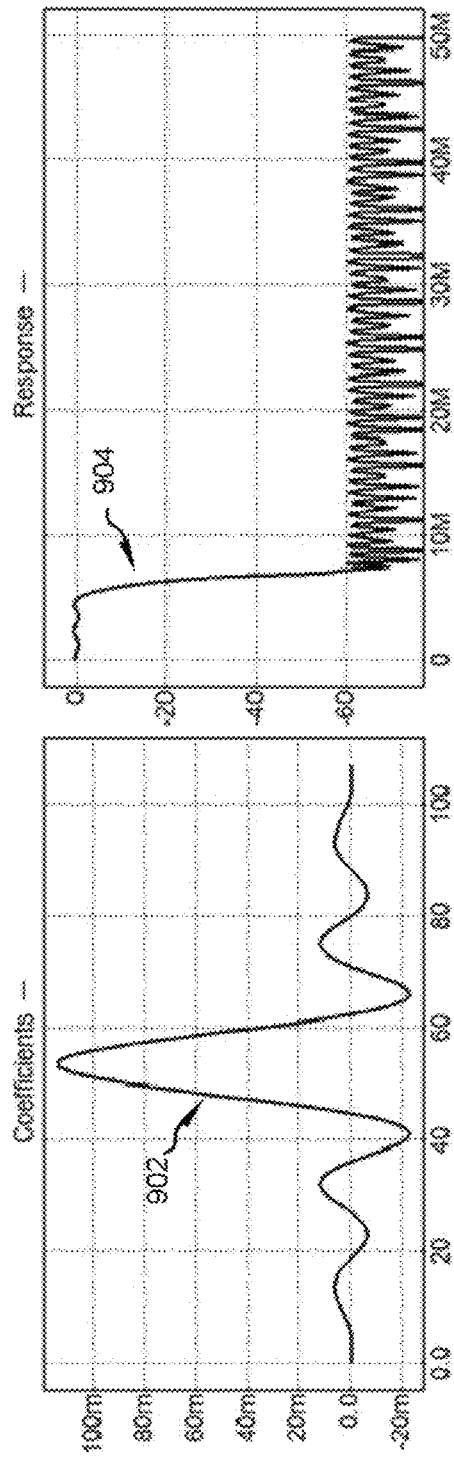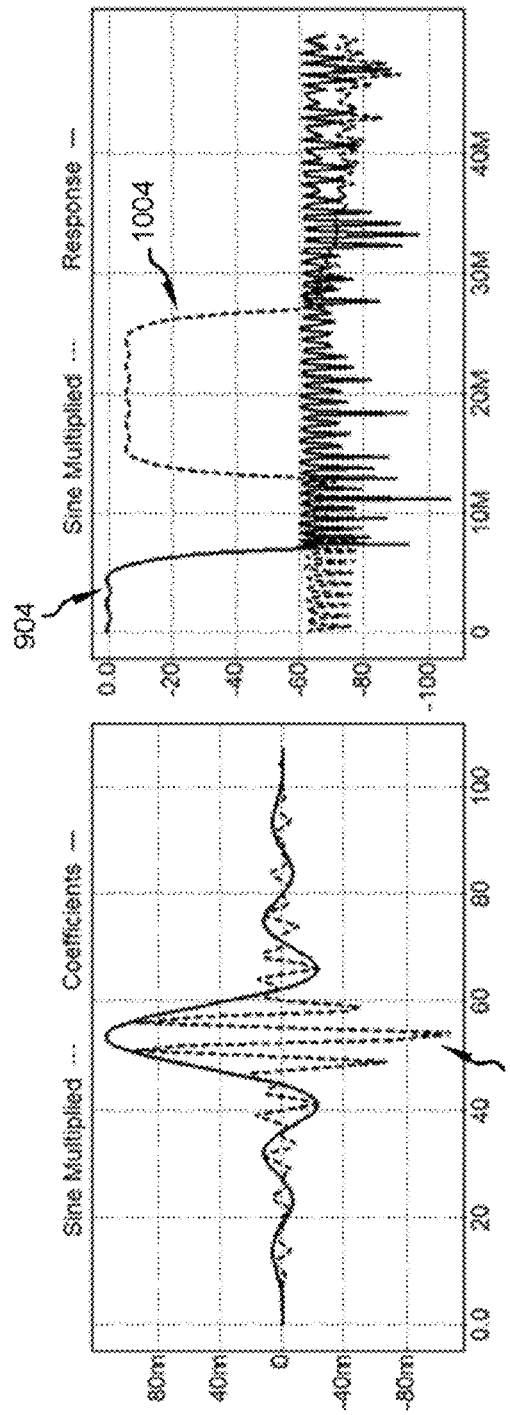
Figure 9
Figure 10

FINITE IMPULSE RESPONSE FILTER FOR PRODUCING OUTPUTS HAVING DIFFERENT PHASES

This application claims priority from Provisional Application No. 61/466,420, filed Mar. 22, 2011, which is incorporated by reference in its entirety.

FIELD OF THE INVENTION

The present invention relates generally to electronic filters, and more particularly to finite impulse response (FIR) filters.

BACKGROUND OF THE INVENTION

There are many situations in circuit design in which it is desirable to generate clock intervals in a system that occur at a higher rate than the system clock. For example, a computer processor may have a primary clock of 66 MHz while it is desirable to operate internally at 3.3 GHz. To do so, each 66 MHz clock interval must be divided into 50 equal parts, so that the 50 parts thus correspond to a clock of 3.3 GHz.

One way to construct a simple "clock doubler" is to delay a clock signal by one-quarter of the clock period. FIG. 1 shows a 100 MHz sine wave signal 102. Such a signal has a clock period of 10 nanoseconds (ns), so that the first clock cycle shown starts at 0 and ends at 10 ns on the horizontal axis, where another clock cycle begins. As is easily seen, signal 102 also has a zero crossing at 5 ns, since a negative (where the signal is falling) edge falls halfway between the positive (rising) edge of the first clock cycle that begins at 0, and the positive edge of the second cycle that begins at 10 ns. Signal 102 will thus have zero crossings that are regularly spaced every 5 ns. Typically, each zero crossing, whether from a positive or negative edge, may be used as a trigger for circuit components.

As also shown on FIG. 1, if the 100 MHz signal 102 is delayed by 2.5 ns, and the delayed signal 104 overlaid on the original signal, there will be additional zero crossings halfway in between the zero crossings of the original signal, i.e., regularly spaced every 2.5 ns, since every zero crossing in the original signal is replicated 2.5 ns later in the delayed signal. Thus, the original signal is in effect doubled, as there are now regularly spaced zero crossings every 2.5 ns, rather than only every 5 ns as with only the original signal.

However, while it is well known in the prior art how to make such a fixed time delay, a delay of a given period only results in the additional zero crossings being at equal intervals for a clock signal of a single frequency, i.e., a signal in which the delay is one-quarter of the clock period. If the frequency is changed but the delay remains constant, the zero crossings will not be at regular intervals.

This may be seen in FIG. 2, which shows the result of changing the signal frequency from 100 MHz, as in FIG. 1, to a signal 202 of 150 MHz, while keeping the delay at 2.5 ns, resulting in a delayed signal 204. While each signal 202 and 204 has regularly spaced zero crossings, and there are still twice as many zero crossings as with only the original signal 202, the combined zero crossings of both signals are no longer equally spaced. Thus, the delayed signal 204 cannot be used to effectively make a faster clock than that of the original signal 202, since that faster clock will be irregular.

This shows that a fixed time delay will only result in a regular doubling of a clock frequency if the time delay corresponds to one-quarter of the clock period. The failure to obtain equal spacing in the zero crossings in FIG. 2 is due to the fact that the overlaid signal is delayed by a fixed time, which does not correspond to one-quarter of the clock period of the 150 MHz signal, but rather only to one-quarter of the clock period of the 100 MHz signal of FIG. 1. Thus, a different time delay must be selected for each separate frequency.

There are more complicated circuits which will sub-divide a time interval, such as the example above in which a 66 MHz clock interval must be divided into 50 equal parts to obtain a clock of 3.3 GHz. Such circuits are well known, and are commonly referred to as "clock multipliers," or often "delay locked loops" or "phase locked loops." A typical example of such a prior art circuit is shown in FIG. 3. A circuit 300 contains controlled delay elements D1 to D8 that are used to sub-divide the time interval of successive clock cycles. The circuit 300 operates to adjust the delay of each individual delay element such that the time interval to the end of the delay line is substantially equal to the clock period.

Such prior art implementations require a controller, in this case the integrator 302 in FIG. 3, and the use of a control feedback loop 304. The controller operates to ensure that the delay intervals are uniform, so that an even division of the clock period results. This is necessary so that no output interval is substantially longer than any other, as would be the case if the output of the delay line were reached before the next clock input arrived.

The feedback loop 304 has associated stability criteria and a finite time interval (the inverse of the loop bandwidth) over which it operates. In order to be usable with different frequencies, the delay elements D1 to D8 themselves are necessarily adjustable, and the adjustability may conflict with the need to be free from the time uncertainty of the output of the delay line relative to its input known as "jitter," i.e., the fact that the delay will not be precisely the same for each input clock edge.

Other prior art methods of doubling a clock have been tried, for example, sending a clock signal down a delay line, and tapping the signal at a point on the delay line which corresponds to half a clock cycle. One of skill in the art will appreciate that in such a case it is difficult to find the appropriate spot on the line at which to tap the signal, i.e., the point at which the delay will exactly match halt the clock cycle.

For these and other reasons, prior art methods of providing high speed clock are not entirely satisfactory and result in design compromises and non-optimal solutions.

SUMMARY OF THE INVENTION

Systems and methods are disclosed for using a finite impulse response (FIR) filter to create a plurality of output signals, each output signal having the same frequency response but at a different phase from the other output(s).

One embodiment describes a method of designing a finite impulse response filter having a delay line containing a plurality of delay elements, the method comprising: selecting a desired frequency response for the filter; selecting a plurality of sets of elements having impedances, one element from each set to be coupled to the delay line after each delay element, the values of the elements selected to determine their impedances so that for each set of elements the sum of the outputs of the elements is a signal of the same frequency response as, but a different phase from, the sum of the outputs of another set of elements; and, for each set of elements, providing an output connected to all of the elements in the set that is separate from the outputs connected to the other sets of elements.

Another embodiment describes an apparatus comprising: an input configured to receive an input signal; a delay line comprising a plurality of delay elements in series and connected to the input for propagating the input signal; a first plurality of buffers, each buffer in the first plurality of buffers receiving the delayed input signal after the input signal has passed through a separate one of the plurality of delay elements; a first plurality of elements having impedance values, each of the first plurality of elements connected to a separate one of the first plurality of buffers and chosen to determine their impedances so that the sum of the outputs of the first plurality of elements produces a desired frequency response to the input signal; a first output connected to the first plurality of resistor values to produce a first output signal having the desired frequency response; a second plurality of buffers, each buffer in the second plurality of buffers receiving the delayed input signal after the input signal has passed through a separate one of the plurality of delay elements; a second plurality of elements having impedances, each of the second plurality of elements connected to a separate one of the second plurality of buffers and chosen to determine their impedances so that the sum of the outputs of the second plurality of elements produces the same frequency response to the input signal as the first plurality of elements but at a different phase; and a second output connected to the second plurality of elements to produce a second output signal having the desired frequency response, at the different phase from the first output signal.

In another embodiment, a finite impulse response filter is described, comprising: an input configured to receive an input signal; a delay line comprising a plurality of delay elements in series and connected to the input for propagating the input signal; a plurality of buffers, each buffer receiving the delayed input signal after the input signal has passed through a separate one of the plurality of delay elements; a first plurality of elements having impedance values, each of the first plurality of elements connected to a separate one of the plurality of buffers and chosen to determine their impedances so that the sum of the element outputs produces a desired frequency response to the input signal; a first output connected to the first plurality of elements to produce a first output signal having the desired frequency response; a second plurality of elements having impedance values, each of the second plurality of elements connected to a separate one of the plurality of buffers and chosen to determine their impedances so that the sum of the element outputs produces the same frequency response to the input signal as the first plurality of elements but at a different phase; and a second output connected to the second plurality of elements to produce a second output signal having the desired frequency response, at a different phase from the first output signal.

Still another embodiment describes a computer readable storage medium having embodied thereon instructions for causing a computing device to execute a method for designing a finite impulse response filter having a delay line containing a plurality of delay elements, the method comprising: selecting a desired frequency response for the filter; selecting a plurality of sets of elements having impedance values, one element from each set to be coupled to the delay line after each delay element, the values of the elements selected to determine their impedances so that for each set of elements the sum of the outputs of the elements is a signal of the same frequency response as, but a different phase from, the sum of the outputs of another set of elements; and for each set of elements, providing an output connected to all of the elements in the set that is separate from the outputs connected to the other sets of elements.

Another embodiment discloses a computing device for simulating the response of a finite impulse response filter to a set of data elements representative of an input signal at successive points in time, comprising: an input for selecting a frequency response of the finite impulse response filter; a processor configured to: select a first set of weights to be applied to the set of data elements to generate a set of first weighted data elements, such that the sum of the first weighted data elements is a first signal of the selected frequency response; select a second set of weights to be applied to the set of data elements to generate a set of second weighted data elements, such that the sum of the second weighted data elements is a second signal of the selected frequency response at a different phase from the first signal of the selected frequency response; a first output for providing the first output signal of the selected frequency response; and a second output for providing the second output signal of the selected frequency response.

BRIEF DESCRIPTION OF THE DRAWINGS

FIG. 9 illustrates one possible set of Fourier coefficients for a low pass filter and the resulting filter output.

FIG. 10 illustrates a method of changing a low pass filter to a band pass by altering the Fourier coefficients of FIG. 9 by multiplying them by a sine wave.

DETAILED DESCRIPTION OF THE INVENTION

The present application describes the design and implementation of a finite impulse response (FIR) filter to create a plurality of output signals, each output signal having the same frequency but at a different phase shift from the other output(s). The phase shift is constant and independent of the frequency of the output signal.

It has been found that a FIR filter with multiple outputs of the same frequency and differing phases may be created by selecting different impedance values for each output as explained herein. The ability to maintain a constant phase difference regardless of frequency can be of significant use in situations in which the known technique of maintaining a fixed delay time described above fails to accomplish a desired result. While it is expected that one use of the described apparatus and method will be to generate a number of outputs of equally spaced phase shifts, such equal spacing is not necessary, and any desired set of phase shifts may be generated as will be described.

Figure 1:
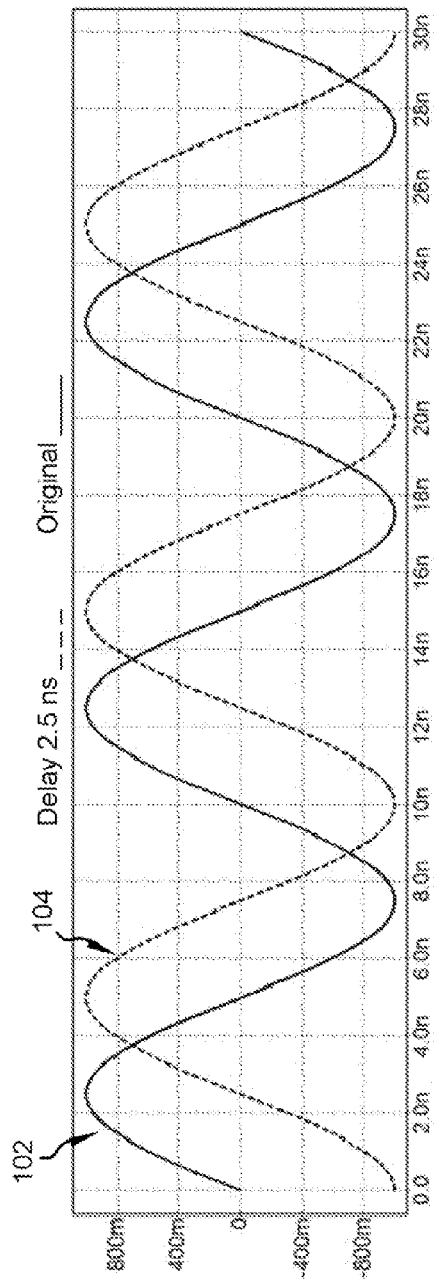
FIG. 1 is a graph of a clock signal, showing the effect of adding a delayed clock signal in one example.
Figure 2:
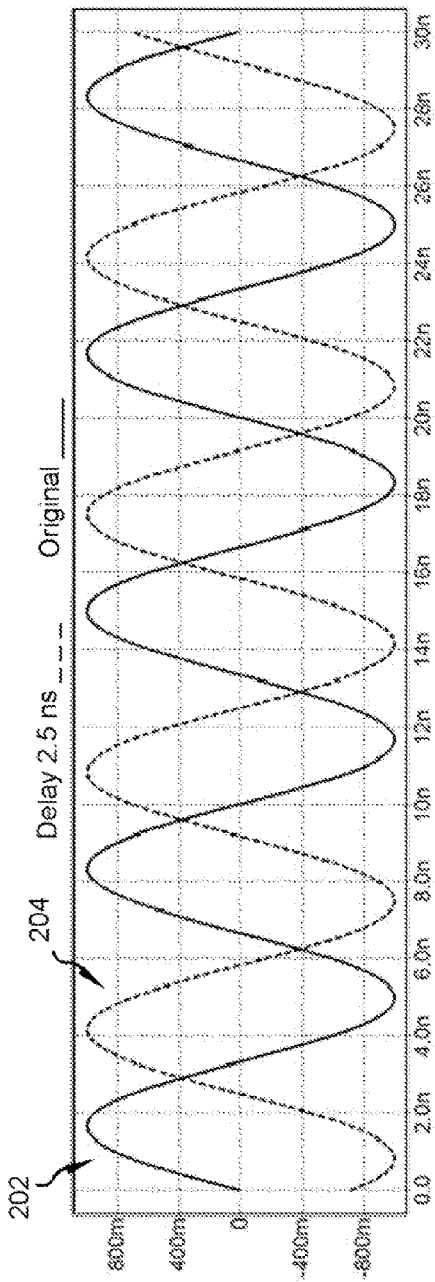
FIG. 2 is a graph of another clock signal, showing the effect of adding a delayed clock signal as in FIG. 1.
Figure 3:
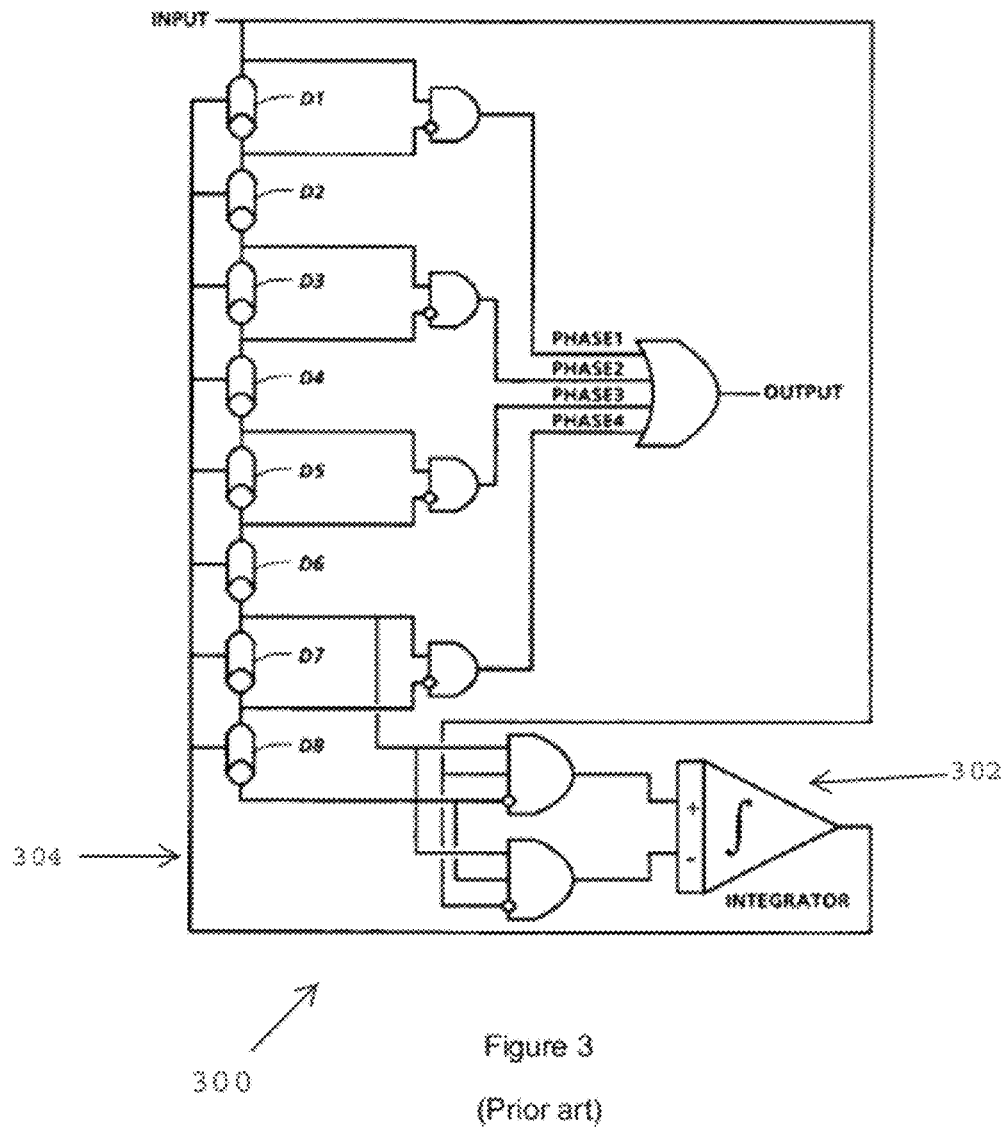
FIG. 3 is a block diagram of one example of a clock multiplier circuit of the prior art.
Figure 4:
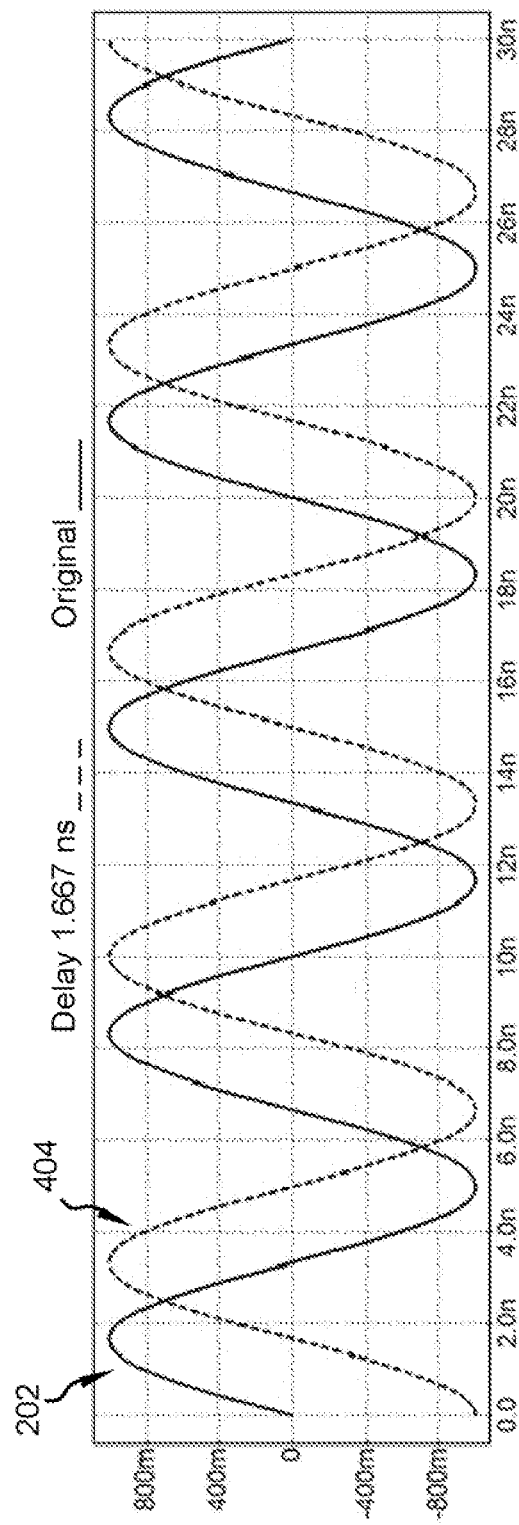
FIG. 4 is a graph of the clock signal of FIG. 2, showing the desired effect of adding a delayed clock signal.

Returning to the example of FIGS. 1 and 2, as above a fixed time delay will only result in a regular doubling of a clock frequency if the time delay corresponds to one-quarter of the clock period. In the case of the 150 MHz signal of FIG. 2, the 2.5 ns delay is not one-quarter of the clock period, and the zero crossings are not evenly spaced. However, if the second signal can be delayed by a constant phase shift of 90 degrees, regardless of frequency, then a doubling of any clock can be reliably obtained. In FIG. 4, such a 90 degree phase shift results in the signals 202 and 404 of FIG. 4, in which a 150 MHz clock 202, as seen in FIG. 2, has been effectively doubled, with zero crossings that are now uniform, rather than the non-uniform zero crossings of FIG. 2 created by a fixed delay that does not properly correspond to the frequency.

Further, when such a fixed phase shift delay regardless of output frequency is obtained without the need for a control loop and an adjustable delay line, a circuit responds to a change in input frequency more quickly, since it is not limited by loop bandwidth, and generally has less jitter, since the delay elements are fixed and not compromised by an adjustment mechanism. It is believed that such a circuit or method is thus a significant improvement over the prior art.

A finite impulse response (FIR) filter is a type of electronic filter with a broad range of applications. FIR filters are widely used in both digital signal processing and digital video processing, and their construction is well known in the prior art.

Figure 5:
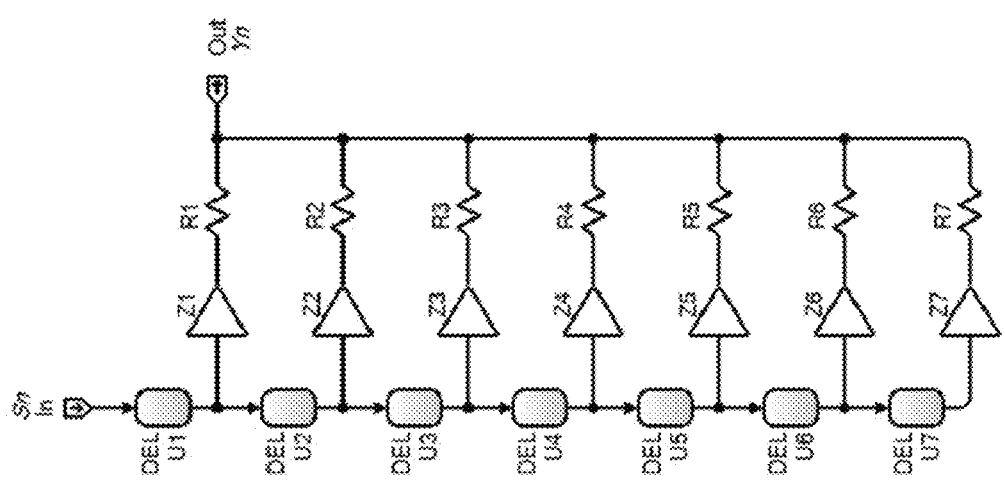
FIG. 5 is a block diagram of a finite impulse response (FIR) filter as known in the art.

One type of FIR filter is a transversal filter, or tapped delay line filter, as shown in FIG. 5. The output of such a filter is a weighted combination of voltages taken from uniformly spaced taps. The filter contains a plurality (here 7 are shown) of unit delay elements U1 to U7, each of which introduces a delay of time t. The filter is considered to be of the Mth order, where M−1 is the number of delay elements, so the filter of FIG. 5 is an $8^{th}$ order filter.

The output of each of the delay elements U1 to U7 is connected to an element having an impedance value, typically through some buffering means, such as buffers Z1 to Z7; here, the elements having impedance values are shown as resistors R1 to R7. One of skill in the art will recognize that while this example and the following discussion use resistors to indicate the impedance values for purposes of illustration, other circuit elements also have impedance values, for example, capacitors, inductors, depletion mode MOSFETs, and other devices, and any device having an impedance that does not otherwise interfere with operation of the filter may be used to provide the desired impedance values as described herein.

The resistors all share a common output point. As an input signal progresses through the delay elements, each resistor causes the signal on the respective delay element to which it is attached to contribute to the output signal in inverse proportion to the resistor value. Thus, if the resistor is small, the signal on the attached delay element will have a large contribution to the output voltage, while if the resistor is large the contribution to the output will be smaller.

Figure 6:
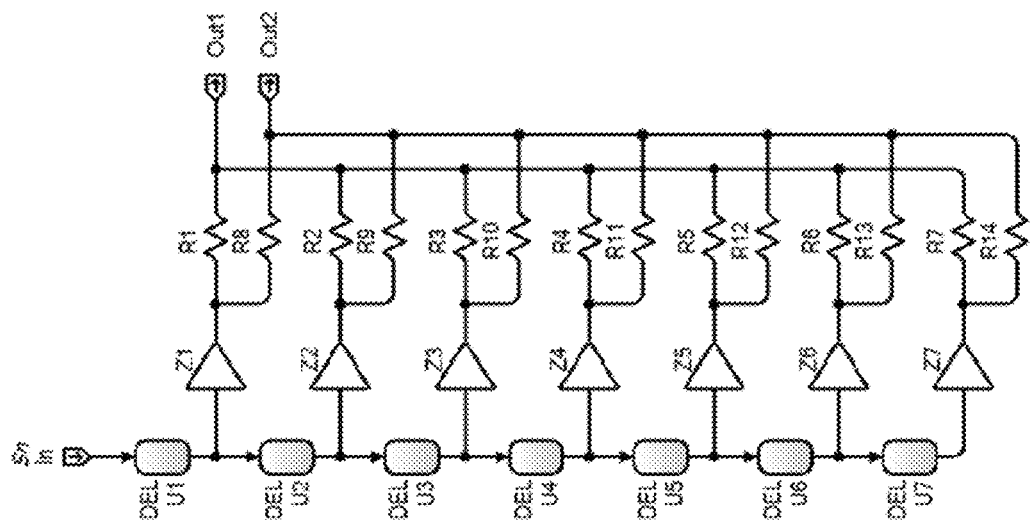
FIG. 6 is a block diagram of a FIR filter having two outputs.

FIG. 6 shows a FIR filter similar to that of FIG. 5, but with a second set of resistors R8 to R14 sharing the same delay line and buffers. The second set of resistors is thus able to provide a second output simultaneously with the first output produced by resistors R1 to R7 without duplicating all of the circuit elements. It will be apparent that more outputs may be added by adding additional sets of resistors, so that a common delay line and buffers may be used to make a multi-output FIR filter.

By properly selecting the resistor values in a set of resistors, a FIR filter is designed to provide an output with a desired frequency response. The resistor values are typically calculated by a software program which takes the desired frequency response as an input. Since the two sets of resistors R1 to R7 and R8 to R14 in FIG. 6 are independent, it is thus possible to use the circuit of FIG. 6 to generate two outputs having different frequency responses to a single input signal.

It is also possible to use the circuit of FIG. 6 to generate two outputs that have the same frequency response. This would normally be considered redundant, but the present invention utilizes the fact that it is possible to generate two outputs having the same frequency response, but also having a different time domain response, i.e., that differ in phase as the signals in FIGS. 1, 2 and 4 differ in phase. In a filter designed as described herein, the phase difference is constant and independent of the output frequency, and thus independent of the input frequency as well.

It is well known that the mathematical basis of a FIR filter is the mathematics of Fourier transforms, and is characterized by a convolution of the successive values of the input signal with a set of values referred to as the impulse response of the filter. The output of the filter is a weighted sum of the current input value and a finite number of previous values of the input. When a delay element operates on an input $S_n$, the current output is $S_{n-1}$, i.e. the input one delay period before. Thus, $S_{n-k}$ is the filter input at a time $T_0$ plus (n−k)*t, which is also the output of the kth delay element at time $T_0$ plus n*t. Each buffer/resistor combination Z1/R1 to Z7/R7 acts as a multiplier and multiplies the tap input to which it is connected by a filter coefficient referred to as the tap weight Wk so that the multiplier connected to the kth tap input $S_{n-k}$ produces an output $S_{n-k}*W_k$.

The outputs of the resistors R1 to R7 are summed to produce the filter output. For an Nth order filter, this overall output $Y_n$ is given by the formula:

$$Y_n = W_0 * S_n + W_1 * S_{n-1} + W_2 * S_{n-2} + \ldots + W_N * S_{n-N}$$

or $$Y_n = \sum_{k=0}^{N} S_{n-k} * W_k$$

These values of the impulse response, known as coefficients the coefficient domain, are provided by the resistors in FIGS. 5 and 6; they approximate the Fourier transform of the desired frequency domain response.

For example, as will be understood by one of skill in the art, if the impulse response is Gaussian, such that the coefficient values C(x) of the impulse response are in the form:

$$C(x) = e^{-\alpha x^2}$$

then the Fourier transform is a sine wave that is also Gaussian with an inverse standard deviation, and of the form:

$$F(\omega) = \sqrt{\frac{\pi}{\alpha}} * e^{-\frac{\pi^2 \omega^2}{\alpha}}$$

where e is Filler's number (2.18281828), ω is frequency and α is a parameter that determines the center position of the peak and the width of the bell shape of the frequency response.

It can also be seen by one of skill in the art that the standard deviation of the Gaussian response in the coefficient and frequency domains are inversely related, i.e., the parameter a multiplies $x^2$ in the coefficient domain but divides $\omega^2$ in the frequency domain. This leads to the observation that as the desired frequency domain result tends to a single point at zero frequency (a Gaussian function of zero standard deviation, known as the Dirac Delta Function), the coefficients extend to an infinite series of unit values, i.e., all 1's.

It is also a well-known property of the Fourier transform that a frequency shift corresponds to a multiplication of the coefficient values by $e^{i\omega x}$, i.e., by a complex sinusoidal term. Consequently, the coefficient values representing a single non-zero value in the frequency domain are of the form $e^{i\omega x}$, i.e., they are sinusoidal and extend to infinity. Thus, in order to construct a perfect filter, an infinite sequence of coefficient values, i.e., delay elements and resistors, are required.

Since any practical implementation can of course not be of infinite extent, and generally must be quantized in time and amplitude as well, a window function, or tapering function, is used. As is well known in the art, a window function is a function with a value of zero outside some chosen interval. A common type of window function used in filters is a rectangular window, which lets a signal pass through when it is within the frequency bounds of the window, and results in a value of zero outside the window. The use of an appropriate window function not only limits the series of coefficients to a finite number, but can also suppress the occurrence of Gibbs phenomena, the oscillations that occur due to the behavior of a Fourier series at a discontinuity as a result of the truncation of the series.

One particular window function that is well known is a Kaiser window. The Kaiser window is generally considered to be a "near perfect" window function, and, when applied to a sine wave, is believed to result in as close to an impulse response as is possible. In one embodiment, the Kaiser window may be parameterized by $\alpha=3$. If the Kaiser window function is represented by $K_{\alpha=3}(i)$, then a reasonably sufficient approximation of the Fourier transform coefficients for the Dirac function, indexed by i, is given by:

$$C(i)=K_{\alpha=3}(i)*\sin(\omega*\delta*i)$$

where $\omega$ is the non-zero radian frequency in the frequency domain plot, and b is the unit delay in the delay line.

This expression is one degenerate case of the more general expression:

$$C(i)=K_{\alpha=3}(i)*e^{j(\omega\delta i+P)}$$

where j is the square root of −1 and P is an arbitrary phase factor. For any value of P, this expression is also the Fourier transform of the Dirac function.

One of skill in the art or sufficiently versed in mathematics will appreciate that the frequency domain shape approximating the delta function from this windowed approximation is identical for any value of P, although the resulting phase shift of the signal will be different. Thus, if two filters are implemented with coefficients calculated using the same values for the parameters, except for the value of P, they will have identical frequency responses but different phases.

In fact, if the coefficients for two such filters are calculated using P=0 for one, and P=π/2 for the other, the two output signals will differ in phase by 90 degrees. This phase difference will be due only to the value of P, and does not depend on the value of $\omega$ or $\delta$. It is this fact that allows for the creation of specific phase shifts in the output.

P is a scalar quantity with no dimension or units, and may be of any value. It will be appreciated that P operates on the coefficient equation "modulo $2\pi$," i.e., only the remainder of P after dividing by $2\pi$ has any effect, so that it always appears as if P is between zero and $2\pi$. It will be apparent that this is due to the fact that if P is equal to $2\pi$, then the phase shift will be one complete cycle and it will appear as if there is no phase shift at all.

It should be noted that while this example uses the Kaiser window, there are many possible window functions; for example, another well known window function is the Blackman window. One of skill in the art will appreciate the differences between window functions, and be able to select a suitable window function for a desired application.

As above, one approximation of the Fourier transform coefficients for the Dirac function is given by:

$$C(i)=K_{\alpha=3}(i)*\sin(\omega*\delta*i)$$

Another approximation of the coefficients, having the same frequency response but a phase that differs by 90 degrees, is given by:

$$C(i)=K_{\alpha=3}(i)*\cos(\omega*\delta*i)$$

Figure 7:
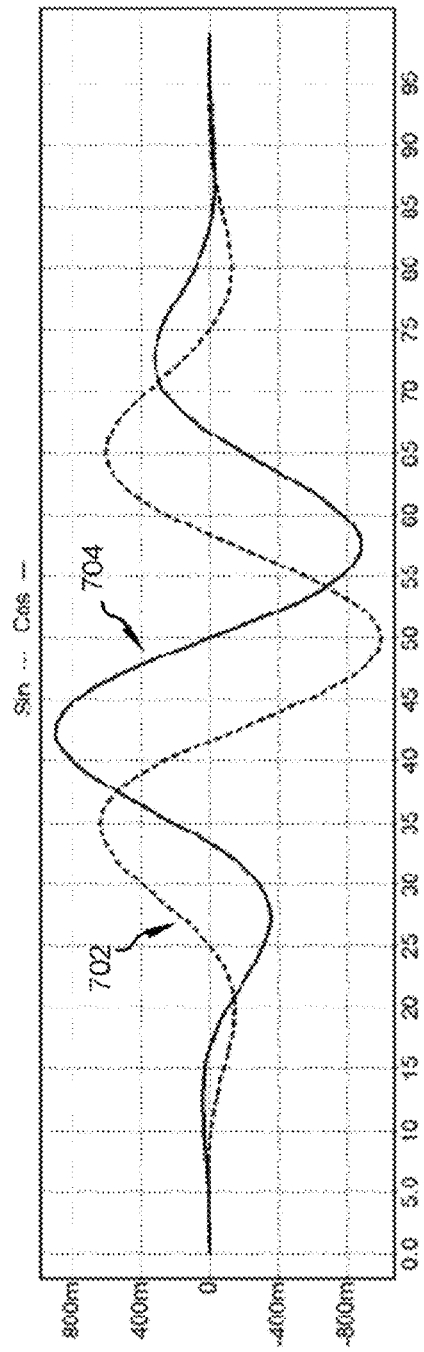
FIG. 7 illustrates one example of two sets of Fourier coefficients, one derived from a sine approximation formula, and one derived from a cosine formula approximation.

In one example, FIG. 7 shows plots representing two coefficient sets calculated in this fashion. A first set of a hundred coefficients is derived from the sine approximation, and a second set of a hundred coefficients is derived from the cosine approximation. While the coefficients are discrete numbers, when they are plotted in sequence against 0-100 on the x-axis, graphing software produces the smooth curves 702 for the sine approximation and 704 for the cosine approximation as shown. It can be confirmed that these two coefficient sets produce outputs having the same frequency response, since they are developed from the same sinusoidal frequency, but have a phase difference of 90 degrees.

Once the coefficients for a particular frequency response and different phase shifts have been calculated, a FIR filter is constructed by using a set of resistors, such as resistors R1 to R7 in FIG. 5, which correspond to the coefficients. As is well known in the art, the resistor values are the inverse of the coefficient values. As is also known, where a coefficient, and thus the corresponding resistor value, is negative, the resistor is driven by an inverse voltage by the use of, for example, differential buffers that give an inverse of the signal on the delay line.

Figure 8:
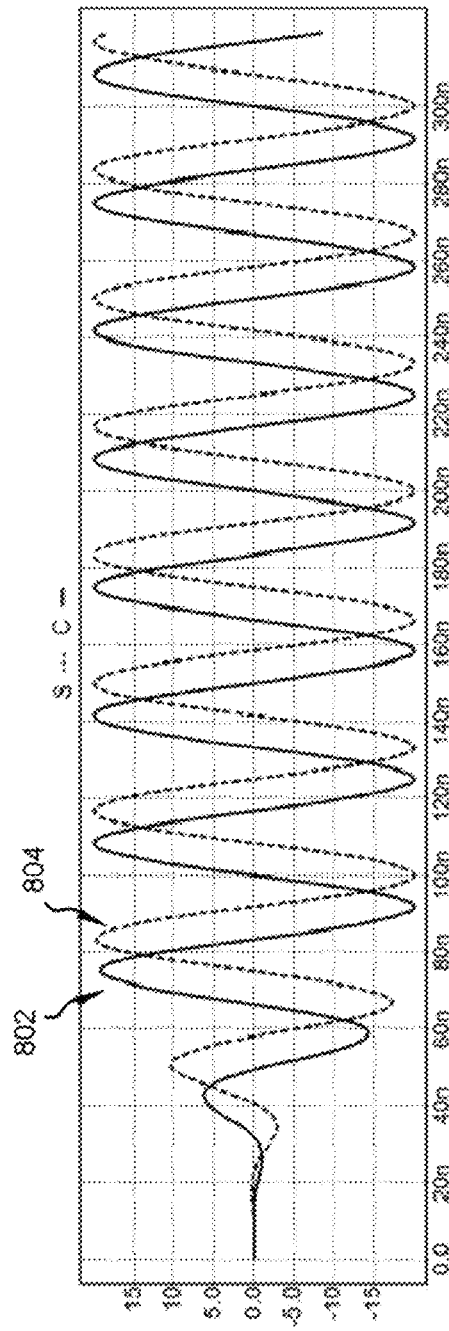
FIG. 8 illustrates the output signals resulting from the Fourier coefficients of FIG. 7.

FIG. 8 shows the response of the two filters constructed using resistors corresponding to the coefficients of FIG. 7, i.e., again the resistor values are the inverse of the coefficient values. Output signal 802 results from resistors having values that are the inverse of coefficient values contained in curve 702, and output signal 804 results from resistors having values that are the inverse of coefficient values contained in curve 704. As above, the frequency response is identical, but the time domain response is not; rather, there is a phase shift of 90 degrees between the two outputs, since the value of P differs by 90 degrees ($\pi/2$) in the mathematical calculation of the coefficients as above.

In the example of a clock multiplier above, the output signals of FIG. 8 may be fed to a comparator to determine the zero crossings. As is known in the art, the subsequent gating of the comparator outputs may be used to generate twice as many equally spaced zero crossings as are in the clock input.

In this example there are two outputs; however, the described technique may be used to generate any arbitrary number N of differing phases by using an appropriate number of values of P. This is done by calculating a set of coefficients $C_j$ for each separate output according to the equation:

$$C_j(i)=W(i)*\sin(\omega*\delta*i+P_j)$$

where W is the selected window function, ω is the desired center frequency of the filter, δ is the unit delay, i is the index into the coefficients, and j goes from 0 to N−1.

Further, while in this example the phase difference is 90 degrees, any desired phase difference may be obtained by appropriate selection of the value of P. In the case of a clock multiplier, a clock signal may be multiplied by a desired number by selecting the desired number of values of P evenly spaced between 0 and 2π, i.e., 0 to 360 degrees. While it may appear to be easiest to multiply a clock signal by a number by which 360 degrees is neatly divided, this is not necessary; using the described technique, it is easily possible to multiply a clock signal by any number even if that number is not a factor of 360, such as, for example, 11 or 17.

In practice, the coefficients for a FIR filter do not have to be calculated from original mathematical principles as described above, but rather can be the result of an iterative method using an approximation algorithm of some type. One such well known algorithm is the Parks-McClellan algorithm, often considered to be a standard method of FIR filter design. Such approximation algorithms are well known and available in computer code and software that is commercially available, such as MATLAB© from MathWorks™.

Such iterative methods create only a single FIR filter, rather than a set of filters having the desired fixed phase relationships. Further, software such as MATLAB© does not allow for the entry of a phase factor P. Thus, in order to obtain the desired multiple outputs of different phase it is necessary to convert the single filter output of an iterative method into multiple filters having identical frequency responses and different phase outputs.

One way of accomplishing this relies on the property of Fourier transforms that a frequency shift in the frequency domain corresponds to multiplication by a sine wave in the coefficient domain. It has been observed that the actual phase of the sine wave used to perform this frequency shift makes no difference to the frequency domain result, but it does affect the time domain result.

FIG. 9 shows a curve 902 which is again the result of smoothing a set of discrete coefficients, and the resulting frequency response 904 from those coefficients, from an iterative method for a low pass filter operating at 100 MHz and passing a signal up to 4 MHz. This filter may be converted into a band pass filter by multiplying the coefficient values by a sine function. Since the filter operates at 100 MHz, it thus has a delay of 10 ns in each coefficient.

Suppose the coefficients of FIG. 9 are to be multiplied by a sine wave of 20 MHz. Such a sine wave is represented as sin(2π*20 MHz*10 ns*i), or simply sin(1.2566*i). Multiplying the coefficients C(i) by this results in $$C'(i)=C(i)*\sin(1.2566*i)$$

and in the curve 1002 containing the resulting coefficients and the response 1004 from those coefficients shown in FIG. 10, (As shown in FIG. 10, the coefficients are also multiplied by √2 to compensate for an amplitude shift and keep the rejection level the same on FIGS. 9 and 10, although this is not strictly necessary.) It will be seen in FIG. 10 that, as expected, the multiplication by a sine wave in the coefficient domain has resulted in a 20 MHz shift in response in the frequency domain as described above.

Figure 11:
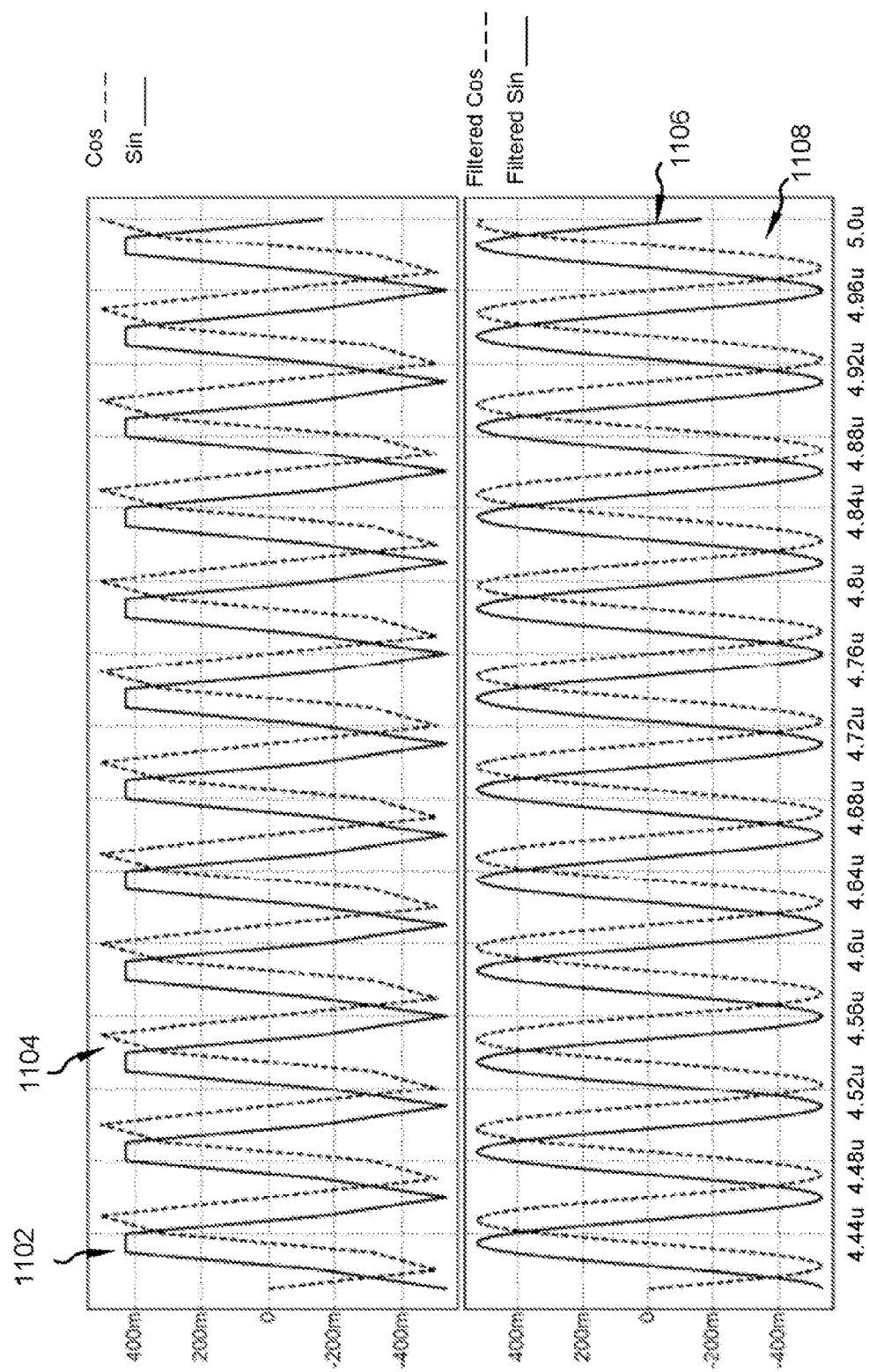
FIG. 11 illustrates an example of the difference in phase between signals for which the Fourier coefficients have been multiplied by a sine wave and a cosine wave.

As will be expected, multiplying the coefficients by the cosine has the same effect in the frequency domain as multiplying by the sine. However, in the time domain, there is a phase difference between the sine and cosine shifted filters, FIG. 11 shows the output of the sine and cosine shifted filters, both the raw or unfiltered output signals 1102 (sine filter) and 1104 (cosine filter), and the filtered or smoothed output signals 1106 (sine filter) and 1108 (cosine filter). The phase difference is clear. Thus, even when the coefficients are generated non-analytically, multiple outputs having a common frequency response with predictable phase shifts can be created by employing a frequency shift.

From this it may be seen that a plurality of FIR filters sharing a delay line and having outputs with the same frequency response and different phases may be constructed by using coefficients derived from the equation:

$$C_j'(i)=C(i)*\sin(\omega*\delta*i+P_j)$$

where C(i) is the set of coefficients from the iterative method, and the other values are as stated above.

As shown in the example above, the initial coefficients may be determined for a low pass filter, and the frequency shift equal to the desired center frequency of a band pass filter. However, this is not required, and the coefficients may be first determined for a band pass filter which is then shifted in frequency from its center frequency to a desired center frequency of the phase-shifting FIR filter.

Returning to the example of a computer processor having a primary clock of 66 MHz it should be noted that due to the vagaries of semiconductor manufacture the clock signal on a particular processor chip may typically vary as much as plus or minus 20 percent or more from the nominal value, so that the expected 16 ns interval between cycles could be closer to 10 or 20 ns in a given instance. Thus, it is desirable to allow for a clock that runs from, for example, 40 MHz to 100 MHz.

In such a case, a suitable filter might be designed by Obtaining a set of coefficients from MATLAB©, or some other iterative method, for a 30 MHz low pass filter, and then multiplying the coefficients by a sine wave of 66 MHz (the desired center frequency) to obtain a bandpass filter that allows signals between 36 MHz and 96 MHz. Again, multiple outputs of fixed phase differences may be obtained by multiplying the coefficients by sine waves having a different value of P, thus insuring the desired clock multiplier regardless of the actual frequency of the original clock signal as long as it is within the limits of the bandpass filter.

There is yet another way of generating two coefficient sets that will produce the same frequency response but with different phases in certain situations. This method also has some advantages in building a practical implementation, as the coefficients of the two filters involved will have some similarity.

In the example of the mathematical derivation of coefficients described above, there are two sets of coefficients described by:

$$C_0(i)=W(i)*\sin(\omega*\delta*i+P_0)$$

and $$C_1(i)=W(i)*\sin(\omega*\delta*i+P_1)$$

where $P_0$ and $P_1$ differ by π/2. (This is a generalized equation; in the above example, more specifically $P_0$=0 and $P_1$=π/2.)

Figure 12:
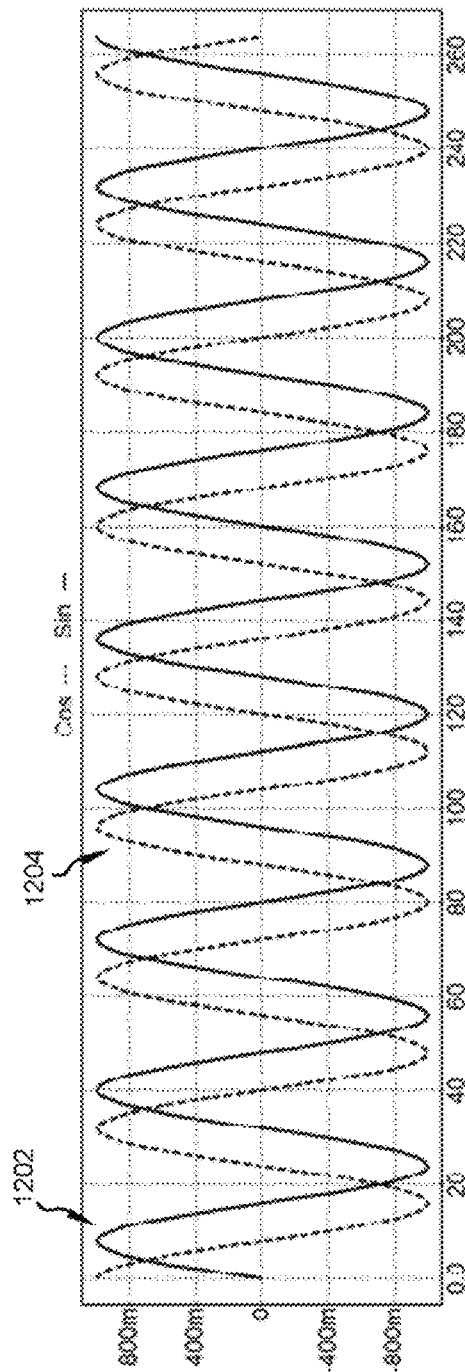
FIG. 12 illustrates two sets of Fourier coefficient sine waves in which the phase has been shifted by one-quarter cycle.

If the length of the filter is additionally constrained so that the coefficient sinusoidal waves end on a quarter-wave boundary (i.e., that the length contains just some integer M and one-quarter cycles), the coefficient sets will appear as shown in FIG. 12. One coefficient sine wave 1202 starts at the beginning of a cycle, i.e., at a rising zero crossing and ends after one-quarter of a cycle. The other coefficient wave 1204 starts one-quarter of a cycle earlier with the last quarter of a cycle and ends at the end of a cycle, i.e., at a falling zero crossing. Reversing one wave in its entirety results in the other wave.

Figure 13:
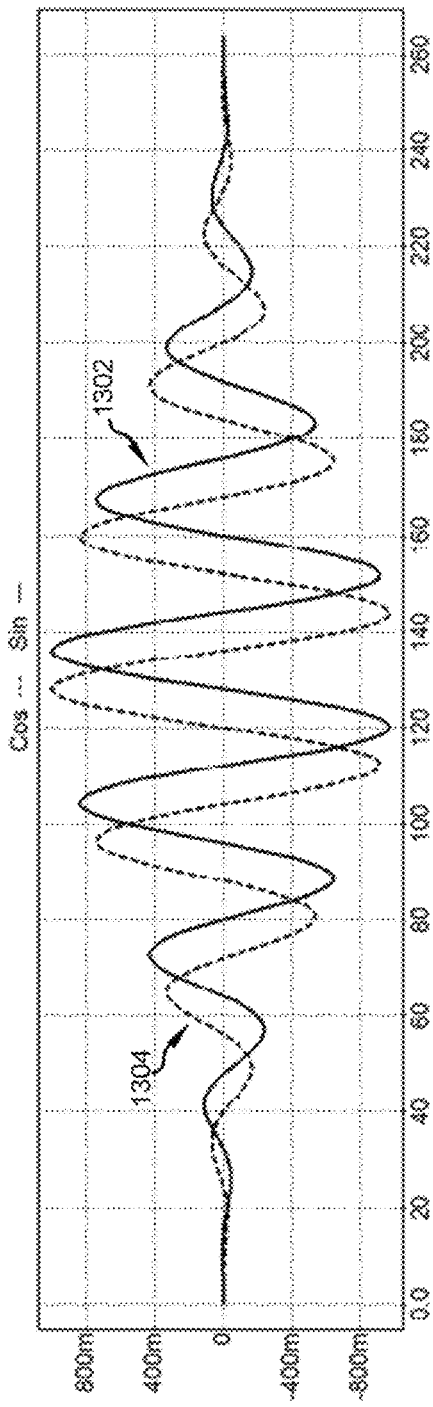
FIG. 13 illustrates two sets of Fourier coefficients created from the sine waves of FIG. 12 to generate two outputs.

Thus, one coefficient set is the same as the other set but reflected about the Y-axis, i.e., the values are the same but one set takes the coefficient values in one order and the other set takes the same values in reverse order. When a window function is applied, the resulting coefficient values may in one example be as seen in FIG. 13. Since a window function is also symmetrical about the Y-axis, the similarity of values is preserved.

This "reflecting" method is limited to making only two filters differing in phase by $\pi/2$, or 90 degrees, but it allows for simple construction of a circuit, as the construction of two identical sets of components is easier than arbitrary sets of elements. The two identical sets of elements that make up the two FIR filters, generally sets of resistors, in one instance are connected to the delay line in one order, and in the second instance are connected to the delay line in reverse order. Thus, for example, with this method, in FIG. 6 resistors R1 through R7 will have values corresponding to a set of coefficients, while resistors R8 to R14 will have the same values in reverse order, so that the value of R1 is the same as the value of R14, R2 is the same as R13, etc.

Figure 14:
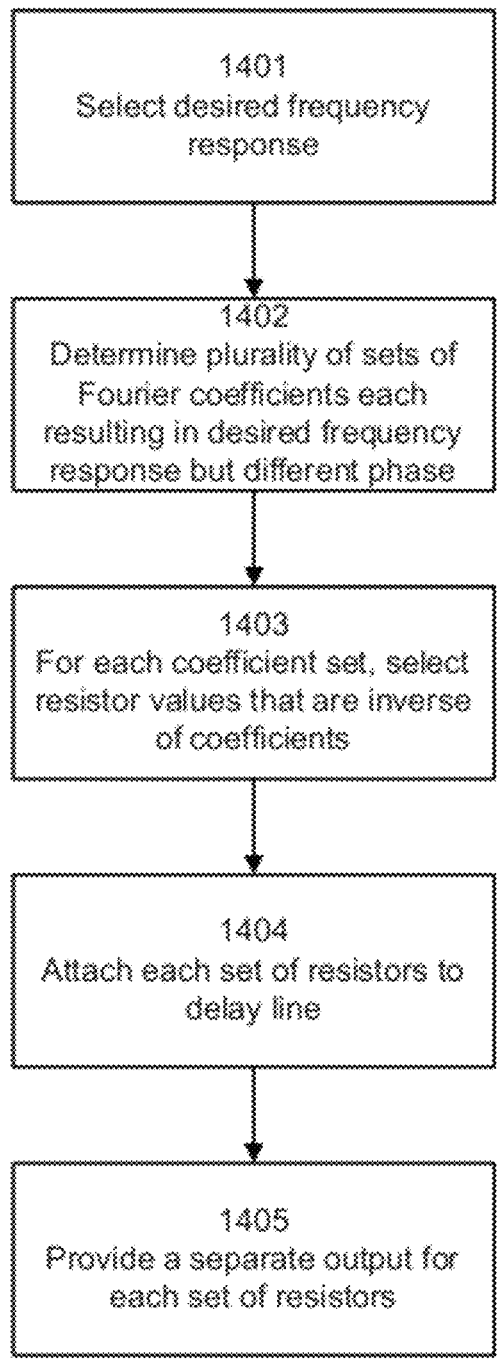
FIG. 14 is a flowchart of a method of designing a FIR filter providing multiple outputs of the same frequency response and differing phases according to one embodiment.

FIG. 14 is a flowchart of one embodiment of a method of designing a FIR filter as described herein. First, a desired frequency response is selected at step 1401.

Next, at step 1402 a plurality of seas of Fourier coefficients are determined, one for each desired output, each set of coefficients resulting in the same frequency response as the other sets, but each resulting in a different desired phase of the output signal. As above, any arbitrary number of outputs may be selected.

At step 1403, sets of resistor values are determined, each set of resistor values corresponding to one of the sets of Fourier coefficients, and each resistor value in a set being the inverse of a different coefficient in the corresponding coefficient set.

Each set of resistors is attached to the delay line at step 1404, and a separate output connection created for each set of resistors at step 1405 so that each output of different phase may be separately accessed.

As described above, the sets of Fourier coefficients may be determined in various ways at step 1402. In one embodiment, the sets of coefficients are each calculated mathematically by including a different phase constant in the calculation of each set. In another embodiment, one set of coefficients is determined by an iterative method, and then that set of coefficients is multiplied by one or more sine waves of different phases to obtain the other sets of coefficients. The iterative method may be performed by software such as, in one example, MATLAB©. In still another embodiment, the length of the filter is constrained so that the coefficient sinusoidal wave ends on a quarter gave boundary, a first set of coefficients is determined, and a second set of coefficients is derived by reversing the order of the first set of coefficients.

The disclosed system and method has been explained above with reference to several embodiments. Other embodiments will be apparent to those skilled in the art in light of this disclosure. Certain aspects of the described method and apparatus may readily be implemented using configurations or steps other than those described in the embodiments above, or in conjunction with elements other than or in addition to those described above.

For example, as discussed above, the elements providing the desired impedance values need not be resistors, but may be, for example, capacitors, inductors or FETs connected as pass devices, depletion mode MOSFETs, or other devices, with the values of the elements (such as capacitance, inductance, etc.) selected to provide the desired impedance values.

It will further be understood by those skilled in the art that while the above description refers to multiple sets of resistors sharing a single delay line, this is not strictly necessary, and two or more similar delay lines could be used instead if appropriate.

Also, while multiple sets of resistors sharing a single set of buffers has been described, there could alternatively be more than one set of buffers. For example, referring to FIG. 6, there could alternatively be one set of buffers connected from the delay line to resistors R1 to R7 and another set of buffers connected from the delay line to resistors R8 to R14. In other embodiments with more than two sets of resistors there could be more than one set of buffers, but with one or more of the sets of buffers sharing multiple sets of resistors.

Still further, while individual resistors providing the desired resistor values are shown herein, this is not required. In some cases a desired resistor value may be easily obtained from a single resistor, while in other cases it may be easier and/or more cost effective to obtain a desired resistor value from some series and/or parallel combination of a plurality of resistors. One method of constructing resistor values and other components from a plurality of repeated identical elements that may be used in connection with the in invention herein is described in commonly-owned U.S. patent application Ser. No. 13/414,522 filed on even date herewith, entitled "System and Method for Series and Parallel Combinations of Electrical Elements," the contents of which are incorporated herein.

In still other embodiments, resistors attached to the delay line at different points may be coupled to an output through an intermediate node rather than directly connected to the output, again possibly for the easier or more cost effective obtaining of the desired impedance values by sharing. HOW to calculate the effective resistance value from individual resistors connected in series and parallel in these situations is well understood by those of skill in the art.

Additionally, while the description herein refers to multiple sets of resistors having the same frequency response and different phases, it is equally possible to have two (or more) pluralities of sets of resistors and the associated buffers sharing a single delay line, each plurality of sets of resistors having a common frequency response different from another plurality of sets of resistors, but the outputs of each set of resistors in a plurality of sets differing in phase from other sets of resistors in that plurality of sets.

One of skill in the art will also appreciate that the above description does not specify precisely what form of data progresses down the delay line. In the use of the described method and apparatus as a clock multiplier, the data may conveniently be a digital signal having only two values, since in such a case the delay elements may be simplified by simply using a series of inverters, which each have a finite delay.

In other cases, however, the data may be an analog signal. The analog signal is then connected to the various sets of resistors or other impedance devices constructed as described herein, and the resulting output signals are a set of filtered analog signals which still maintain a precise phase difference. The outputs thus represent a series of time-delayed versions of the filtered input signal, and the circuit is an analog delay generator, although the delay line is processing a digital signal.

Still further, the input may be analog data that is represented as a pulse width modulation (PWM) or sigma delta (SD) stream of digital data, and thus has a frequency component of the continuous analog signal present in the digital data stream. In these cases, although the delay line only provides digital outputs, the filter may be designed to select the analog signal that is present in the data stream and derive various phase shifted versions of that analog signal. One of skill in the audio field will appreciate that this is how Class-D audio uses PWM to impress the continuous audio signal onto the digital data stream.

Finally, there are in the art digital signal processing software "engines" which are entirely virtual, i.e., in which no physical filter is designed or built, but rather is simulated on a computer processor. Such software typically operates on a set of data elements that represent an input signal at successive points in time; the set of data elements thus implicitly includes the delay times of the delay elements of a particular delay line in a FIR filter. A frequency response of a FIR filter is selected by a user, for example, by means of an input.

Such software engines may be used to implement the methods described herein. In one embodiment, two or more sets of weights are selected and applied to the set of data elements. Each set of weights is selected so that the sum of the weighted data elements is a signal of the selected frequency response; however, the sum of the weighted data elements using one set of weights has a different phase from the sum of the weighted data elements using another set of weights. One of skill in the art will appreciate that each set of weights is thus equivalent to the impedance values that would be used to obtain a selected output signal in an actual FIR filter, so that weighting the data elements is equivalent to the weighting of the delayed input signal in the actual FIR filter.

The outputs created by summing the weighted data elements are thus the same as those that which would be obtained from an actual filter constructed with the implicit delay times of the set of data elements and impedance values which are equivalent to the selected weights. Such software is contemplated as a possible embodiment of the methods described herein and considered to be within the scope of this disclosure.

Other uses of the described method and apparatus are possible. For example, sampling a signal at 1 GHz requires that a sample be taken every 1 ns, but a 1 GHz clock is difficult to make by prior art methods for the reasons discussed above. Using the technique described herein, a clock multiplier may start with a clock of 10 MHz, which is comparatively simple to make, to effectively obtain a 1 GHz clock without the use of, for example, PLL's. Those of skill in the art will appreciate other applications of the described method and apparatus.

It should also be appreciated that the described method and apparatus can be implemented in numerous ways, including as a process, an apparatus, or a system. The methods described herein ma be implemented by program instructions for instructing a processor to perform such methods, and such instructions recorded on a computer readable storage medium such as a hard disk drive, floppy disk, optical disc such as a compact disc (CD)) or digital versatile disc (DVD), flash memory, etc. The methods may also be incorporated into hard-wired logic if desired. It should be noted that the order of the steps of the methods described herein may be altered and still be within the scope of the disclosure.

These and other variations upon the embodiments are intended to be covered by the present disclosure, which is limited only by the appended claims.

What is claimed is:

1. A method of designing a finite impulse response filter having a delay line containing a plurality of delay elements, comprising: receiving at a processor a selected frequency response for the filter; calculating by the processor an impedance value for each of a first plurality of impedance elements of a single type by approximating a first set of Fourier transform coefficients of a Dirac function corresponding to the selected frequency response with a first phase factor and selecting a set of impedance values that are an inverse of the first set of Fourier transform coefficients, each impedance element from the first plurality of impedance elements to be coupled to the delay line after a different delay element than each other impedance element in the first plurality of impedance elements so as to receive a delayed input signal and provide an output weighted by the impedance value of the impedance element, the impedance values of the first plurality of impedance elements calculated such that a sum of the outputs of the first plurality of impedance elements is a first output signal of the selected frequency response; calculating by the processor an impedance value for each of a second plurality of impedance elements of a single type by approximating a second set of Fourier transform coefficients of a Dirac function corresponding to the selected frequency response with a second phase factor and selecting a set of impedance values that are an inverse of the second set of Fourier transform coefficients, each impedance element from the second plurality of impedance elements to be coupled to the delay line after a different delay element than each other impedance element in the second plurality of impedance elements so as to receive a delayed input signal and provide an output weighted by the impedance value of the impedance element, the impedance values of the second set of impedance elements calculated such that a sum of the outputs of the second plurality of impedance elements is a second output signal of the selected frequency response, but having a different phase from the first output signal; and connecting the outputs of the first plurality of impedance elements to provide the first output signal, and connecting the outputs of the second plurality of impedance elements to provide the second output signal.

2. The method of claim 1, wherein approximating a second set of Fourier transform coefficients of a Dirac function corresponding to the selected frequency response with a second phase factor is accomplished by multiplying the first set of Fourier coefficients by a sine wave.

3. The method of claim 1, wherein approximating a second set of Fourier transform coefficients of a Dirac function corresponding to the selected frequency response with a second phase factor is accomplished by reversing the first set of Fourier coefficients.

4. The method of claim 1, wherein approximating a second set of Fourier transform coefficients of a Dirac function corresponding to the selected frequency response with a second phase factor is accomplished by multiplying the first set of Fourier coefficients by a window function.

5. The method of claim 4, wherein the window function is a Kaiser window function.

6. The method of claim 5, wherein the Kaiser window function is parameterized to $\alpha=3$.

7. A finite impulse response filter comprising: an input configured to receive an input signal; a delay line comprising a plurality of delay elements in series and connected to the input for propagating and delaying the input signal; a first plurality of buffers, each buffer in the first plurality of buffers receiving the delayed input signal after the input signal has passed through a separate one of the plurality of delay elements; a first plurality of impedance elements of a single type having impedance values, each of the first plurality of impedance elements connected to a different one of the first plurality of buffers than each other impedance element in the first plurality of impedance elements so as to receive a delayed input signal and provide an output weighted by the impedance value of the impedance element, the impedance values of the first plurality of impedance elements being the inverse of a first set of approximated Fourier transform coefficients of a Dirac function corresponding to the selected frequency response with a first phase factor, such that the sum of the outputs of the first plurality of impedance elements produces a selected frequency response to the input signal; a first output connected to the first plurality of impedance elements to produce a first output signal having the selected frequency response; a second plurality of buffers, each buffer in the second plurality of buffers receiving the delayed input signal after the input signal has passed through a separate one of the plurality of delay elements; a second plurality of impedance elements of a single type having impedance values, each of the second plurality of impedance elements connected to a different one of the second plurality of buffers than each other impedance element in the second plurality of impedance elements so as to receive a delayed input signal and provide an output weighted by the impedance value of the impedance element, the impedance values of the second plurality of impedance elements being the inverse of a second set of approximated Fourier transform coefficients of a Dirac function corresponding to the selected frequency response with a second phase factor, such that the sum of the outputs of the second plurality of impedance elements produces the selected frequency response to the input signal as the first plurality of impedance elements but at a different phase; and a second output connected to the second plurality of impedance elements to produce a second output signal having the selected frequency response, at the different phase from the first output signal.

8. A finite impulse response filter comprising: an input configured to receive an input signal; a delay line comprising a plurality of delay elements in series and connected to the input for propagating and delaying the input signal; a plurality of buffers, each buffer receiving the delayed input signal after the input signal has passed through a separate one of the plurality of delay elements; a first plurality of impedance elements of a single type having impedance values, each of the first plurality of elements connected to a different one of the plurality of buffers than each other impedance element in the first plurality of impedance elements so as to receive a delayed input signal and provide an output weighted by the impedance value of the impedance element, the impedance values of the first plurality of impedance elements being the inverse of a first set of approximated Fourier transform coefficients of a Dirac function corresponding to the selected frequency response with a first phase factor, such that the sum of the outputs of the first plurality of impedance elements produces a selected frequency response to the input signal; a first output connected to the first plurality of impedance elements to produce a first output signal having the desired frequency response; a second plurality of impedance elements of a single type having impedance values, each of the second plurality of elements connected to a different one of the plurality of buffers than each other impedance element in the first plurality of impedance elements so as to receive a delayed input signal and provide an output weighted by the impedance value of the impedance element, the impedance values of the second plurality of impedance elements being the inverse of a second set of approximated Fourier transform coefficients of a Dirac function corresponding to the selected frequency response with a second phase factor, such that the sum of the outputs of the second plurality of impedance elements produces the same frequency response to the input signal as the first plurality of elements but at a different phase; and a second output connected to the second plurality of impedance elements to produce a second output signal having the selected frequency response, at a different phase from the first output signal.

9. A non-transitory computer readable storage medium having embodied thereon instructions for causing a computing device to execute a method for designing a finite impulse response filter having a delay line containing a plurality of delay elements, the method comprising: receiving a selected frequency response for the filter; calculating an impedance value for each of a first plurality of impedance elements of a single type by approximating a first set of Fourier transform coefficients of a Dirac function corresponding to the selected frequency response with a first phase factor and selecting a set of impedance values that are an inverse of the first set of Fourier transform coefficients, each impedance element from the first plurality of impedance elements to be coupled to the delay line after a different delay element than each other impedance element in the first plurality of impedance elements so as to receive a delayed input signal and provide an output weighted by the impedance value of the impedance element, the impedance values of the first plurality of impedance elements calculated such that a sum of the outputs of the first plurality of impedance elements is a first output signal of the selected frequency response; calculating an impedance value for each of a second plurality of impedance elements of a single type by approximating a second set of Fourier transform coefficients of a Dirac function corresponding to the selected frequency response with a second phase factor and selecting a set of impedance values that are an inverse of the second set of Fourier transform coefficients, each impedance element from the second plurality of impedance elements to be coupled to the delay line after a different delay element than each other impedance element in the second plurality of impedance elements so as to receive a delayed input signal and provide an output weighted by the impedance value of the impedance element, the impedance values of the second set of impedance elements calculated such that a sum of the outputs of the second plurality of impedance elements is a second output signal of the selected frequency response, but having a different phase from the first output signal; and providing a connection of the outputs of the first plurality of impedance elements to provide the first output signal, and a connection of the outputs of the second plurality of impedance elements to provide the second output signal.

10. A computing device for simulating the response of a finite impulse response filter to a set of data elements representative of an input signal at successive points in time, comprising: an input for selecting a frequency response of the finite impulse response filter; a processor configured to: calculate a first set of weights to be applied to the set of data elements to generate a set of first weighted data elements by approximating a first set of Fourier transform coefficients of a Dirac function corresponding to the selected frequency response with a first phase factor, such that the sum of the first weighted data elements represents a first output signal having the selected frequency response to the input signal; calculate a second set of weights to be applied to the set of data elements to generate a set of second weighted data elements by approximating a second set of Fourier transform coefficients of a Dirac function corresponding to the selected frequency response with a second phase factor, such that the sum of the second weighted data elements represents a second output signal having the selected frequency response to the input signal but at a different phase from the first output signal of the selected frequency response; a first output for providing the sum of the set of first weighted data elements as a first output signal of the selected frequency response; and a second output for providing the sum of the set of second weighted data elements as a second output signal of the selected frequency response.

11. The method of claim 1 wherein the first and second pluralities of impedance elements of a single type are resistors.

12. The method of claim 1 wherein the first and second pluralities of impedance elements of a single type are capacitors.

13. The method of claim 1 wherein the first and second pluralities of impedance elements of a single type are inductors.

14. The method of claim 1 wherein the first and second pluralities of impedance elements of a single type are MOSFETs.

15. The finite impulse response filter of claim 7 wherein the first and second pluralities of impedance elements of a single type are resistors.

16. The finite impulse response filter of claim 8 wherein the first and second pluralities of impedance elements of a single type are resistors.

17. The finite response filter of claim 7 wherein the second set of Fourier coefficients is the reverse of the first set of Fourier coefficients.

18. The finite response filter of claim 8 wherein the second set of Fourier coefficients is the reverse of the first set of Fourier coefficients.

19. The computing device of claim 10 wherein the processor if further configured to calculate a second set of weights to be applied to the set of data elements to generate a set of second weighted data elements by reversing the first set of Fourier transform coefficients.

* * * * *